US010541311B2

(12) United States Patent
Sekine et al.

(10) Patent No.: US 10,541,311 B2
(45) Date of Patent: *Jan. 21, 2020

(54) SEMICONDUCTOR MEMORY DEVICE AND METHOD FOR MANUFACTURING THE SAME

(71) Applicant: Toshiba Memory Corporation, Minato-ku (JP)

(72) Inventors: Katsuyuki Sekine, Yokkaichi (JP); Tatsuya Kato, Yokkaichi (JP); Fumitaka Arai, Yokkaichi (JP); Toshiyuki Iwamoto, Mie (JP); Yuta Watanabe, Yokkaichi (JP); Atsushi Murakoshi, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/263,459

(22) Filed: Sep. 13, 2016

(65) Prior Publication Data

US 2017/0243945 A1    Aug. 24, 2017

Related U.S. Application Data

(60) Provisional application No. 62/296,845, filed on Feb. 18, 2016.

(51) Int. Cl.
*H01L 29/423*    (2006.01)
*H01L 27/115*    (2017.01)
(Continued)

(52) U.S. Cl.
CPC .. *H01L 29/42324* (2013.01); *H01L 21/28273* (2013.01); *H01L 21/28518* (2013.01);
(Continued)

(58) Field of Classification Search
CPC ................................................. H01L 27/11529
(Continued)

(56) References Cited

U.S. PATENT DOCUMENTS 8,766,351 B2    7/2014    Imamura et al.
8,963,230 B2    2/2015    Imamura et al.
(Continued)

FOREIGN PATENT DOCUMENTS

| JP | 2012-119445 A | 6/2012 |
| JP | 2014-57068 A | 3/2014 |
| JP | 2015-177129 A | 10/2015 |

*Primary Examiner* — Moazzam Hossain
*Assistant Examiner* — Omar F Mojaddedi
(74) *Attorney, Agent, or Firm* — Oblon, McClelland, Maier & Neustadt, L.L.P.

(57) ABSTRACT

In a semiconductor memory device, first insulating films are arranged along a first direction and a second direction and extend in a third direction. Interconnect is disposed between the first insulating films in the first direction and extends in the third direction. Electrodes are disposed between the first insulating films in the first direction on a second direction side of the interconnect, and is arranged along the third direction. Second insulating film is disposed between the interconnect and the electrodes. Semiconductor members are arranged along the third direction between the first insulating films in the second direction and extend in the first direction. The electrode is disposed between the interconnect and the semiconductor members. Third insulating film is disposed between the electrodes and the semiconductor member and is thicker than the second insulating film.

16 Claims, 18 Drawing Sheets

(51) Int. Cl.
    *H01L 23/528*     (2006.01)
    *H01L 21/28*     (2006.01)
    *H01L 27/11556*     (2017.01)
    *H01L 21/285*     (2006.01)
    *H01L 21/768*     (2006.01)

(52) U.S. Cl.
    CPC .. *H01L 21/76816* (2013.01); *H01L 21/76877* (2013.01); *H01L 27/11556* (2013.01)

(58) Field of Classification Search
    USPC .......................................................... 257/317
    See application file for complete search history.

(56) References Cited

U.S. PATENT DOCUMENTS

| | | |
|---|---|---|
| 2014/0073099 A1 | 3/2014 | Park et al. |
| 2014/0286098 A1* | 9/2014 | Yasuda ............... H01L 27/1157 |
| | | 365/185.11 |
| 2015/0249093 A1* | 9/2015 | Lee ................... H01L 27/11582 |
| | | 257/324 |
| 2015/0263126 A1 | 9/2015 | Shingu et al. |
| 2017/0194340 A1* | 7/2017 | Lue ................... H01L 27/11556 |

\* cited by examiner

— 1 —

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/296,845, filed on Feb. 18, 2016; the entire contents of which are incorporated herein by reference.

FIELD

Embodiments relate to a semiconductor memory device and a method for manufacturing the same.

BACKGROUND

Recently, a stacked type semiconductor memory device in which memory cells are three-dimensionally integrated has been proposed. In such a stacked type semiconductor memory device, a stacked body in which electrode films and insulating films are alternately stacked on a semiconductor substrate is provided, and semiconductor members piercing the stacked body are provided. Further, memory cells are formed at each crossing portion between the electrode film and the semiconductor member. For such a semiconductor memory device, an object is to increase an operation speed.

BRIEF DESCRIPTION OF THE DRAWINGS

FIG. 4A shows a program operation, FIG. 4B shows a read operation, and FIG. 4C shows an erase operation;

DETAILED DESCRIPTION

A semiconductor memory device according to an embodiment, includes a plurality of first insulating films, an interconnect, a plurality of electrodes, a second insulating film, a plurality of semiconductor members and a third insulating film. The plurality of first insulating films is mutually separately arranged along a first direction and a second direction crossing the first direction. The plurality of first insulating films extends in a third direction crossing a plane including the first direction and the second direction. The interconnect is disposed between the first insulating films in the first direction and extends in the third direction. The plurality of electrodes is disposed between the first insulating films in the first direction on a second direction side of the interconnect, and is mutually separately arranged along the third direction. The second insulating film is disposed between the interconnect and the plurality of electrodes. The plurality of semiconductor members is mutually separately arranged along the third direction between the first insulating films in the second direction and extends in the first direction. The electrode is disposed between the interconnect and one of the plurality of semiconductor members. The third insulating film is disposed between the plurality of electrodes and each of the semiconductor members and is thicker than the second insulating film.

A method for manufacturing a semiconductor memory device according to an embodiment, includes forming a stacked body by alternately stacking a first insulating film and a first film along a first direction on a substrate. The method includes forming a first trench extending in a second direction crossing the first direction in the stacked body. The method includes forming a first recessed portion extending in the second direction on a side surface of the first trench by removing a portion of the first film through the first trench. The method includes forming a second insulating film on an innermost surface of the first recessed portion. The method includes forming an electrode in the first recessed portion. The method includes forming a third insulating film on a side surface of the first trench, the third insulating film is thicker than the second insulating film. The method includes forming a semiconductor member in the first trench. The method includes dividing the semiconductor member, the third insulating film, and the electrode in the second direction. The method includes forming a second trench extending in the second direction in the stacked body. The method includes forming a second recessed portion extending in the second direction on a side surface of the second trench by removing a residual portion of the first film through the second trench. The method includes forming an interconnect in the second recessed portion.

First Embodiment

First, a first embodiment will be described.

Figure 1:
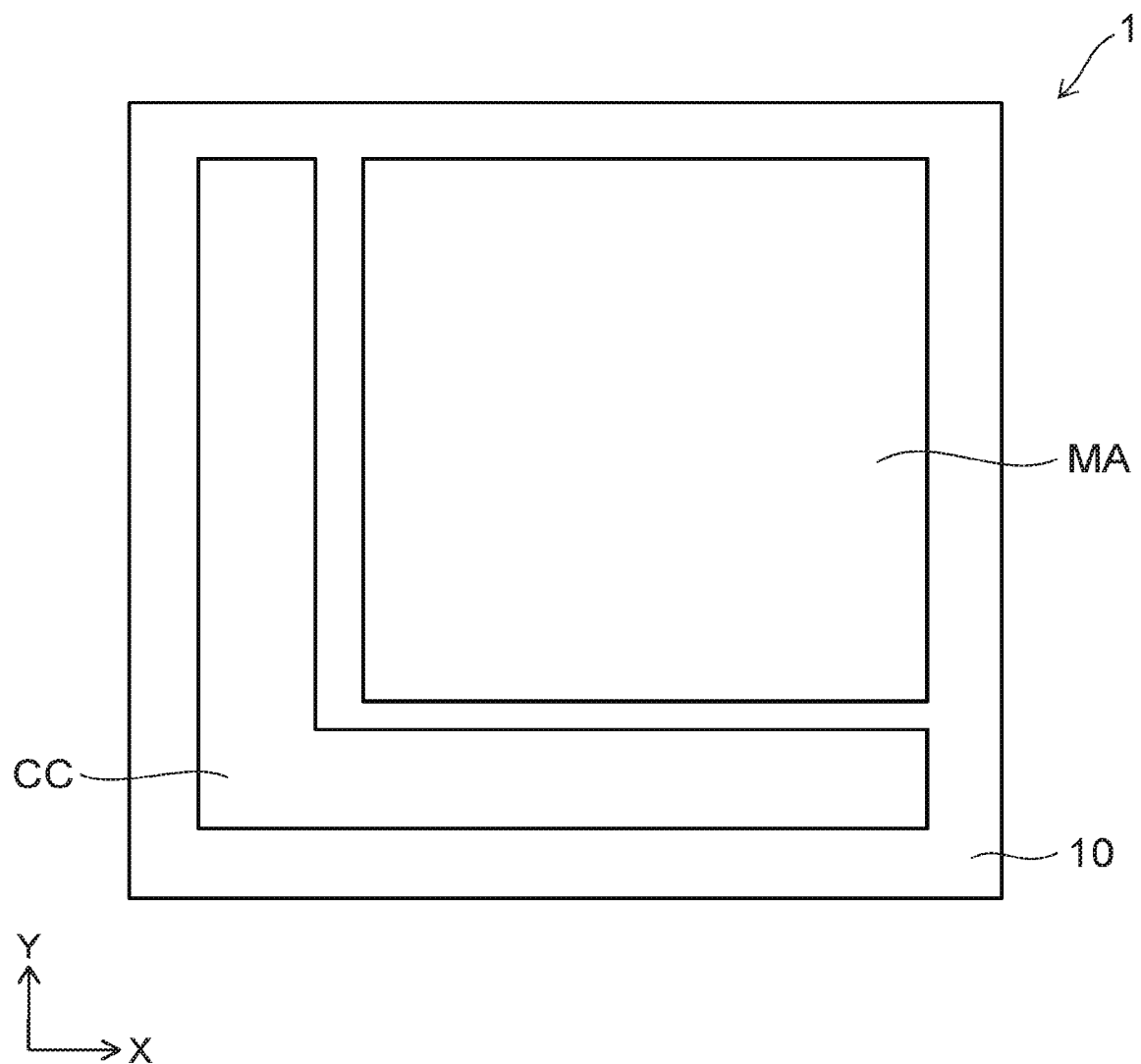
FIG. 1 is a block diagram showing a semiconductor memory device according to a first embodiment.

FIG. 1 is a block diagram showing a semiconductor memory device according to the embodiment.

Figure 2:
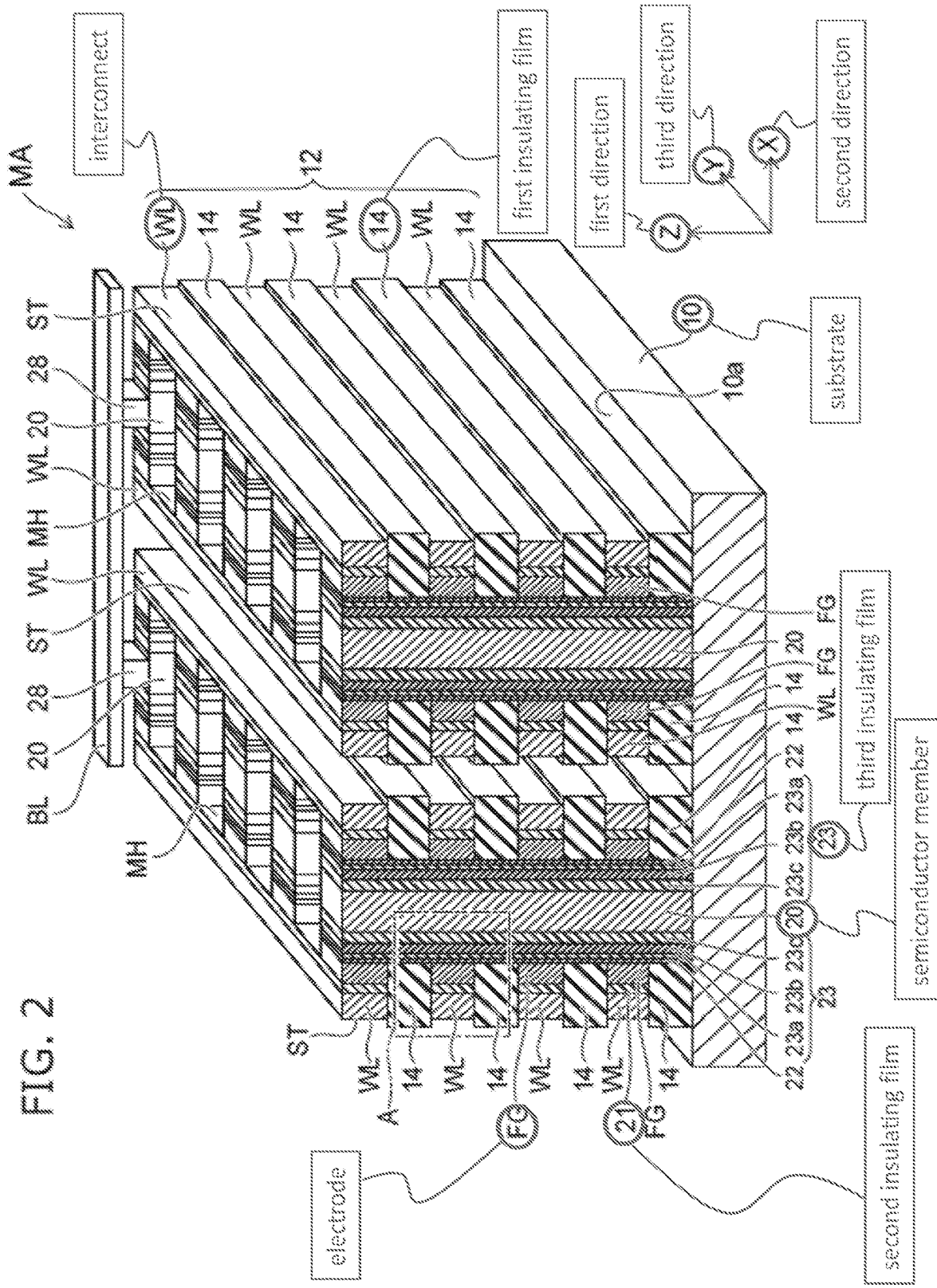
FIG. 2 is a perspective view showing a memory array of the semiconductor memory device according to the first embodiment.

FIG. 2 is a perspective view showing a memory array of the semiconductor memory device according to the embodiment.

Figure 3:
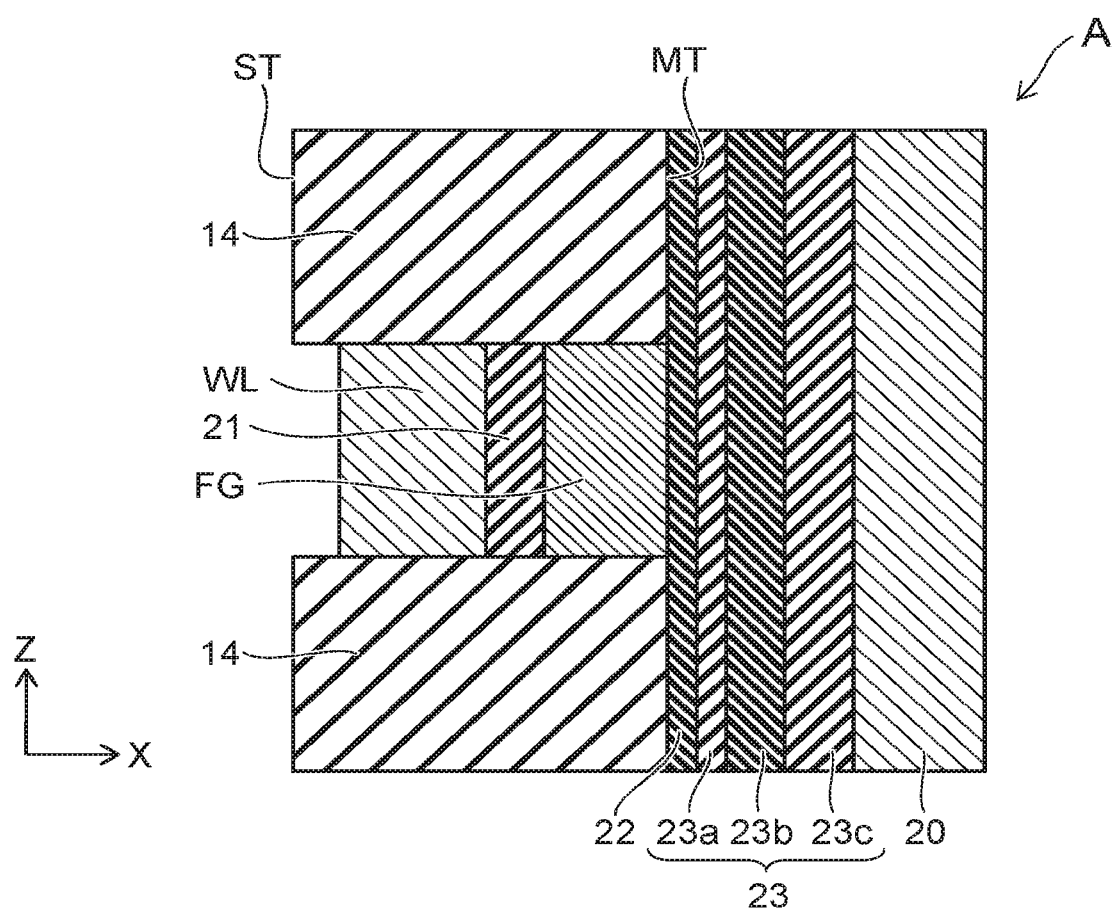
FIG. 3 is a cross-sectional view showing a region A of FIG. 2.

FIG. 3 is a cross-sectional view showing a region A of FIG. 2.

As shown in FIG. 1, in a semiconductor memory device 1 according to the embodiment, in a silicon substrate 10 and on the silicon substrate 10, a memory array MA which stores data and a control circuit CC which drives the memory array MA are provided. The silicon substrate 10 is formed of, for example, a silicon single crystal.

As shown in FIG. 2, in the memory array MA, a stacked body 12 is provided on the silicon substrate 10. Hereinafter, in the specification, for the sake of convenience of description, an XYZ orthogonal coordinate system is adopted. Two directions parallel to an upper surface 10a of the silicon substrate 10 and also orthogonal to each other are referred to as "X-direction" and "Y-direction", and a direction perpendicular to the upper surface 10a of the silicon substrate 10 is referred to as "Z-direction". Further, in the Z-direction, a direction from the silicon substrate 10 to the stacked body 12 is referred to as "upper", and a direction opposite thereto is referred to as "lower", however, this distinction is for reference only, and is irrelevant to the direction of gravity.

As shown in FIGS. 2 and 3, in the stacked body 12, interlayer insulating films 14 composed of, for example, silicon oxide are mutually separately arranged along the Z-direction. In the stacked body 12, a plurality of memory trenches MT extending in the Y-direction and a plurality of slits ST extending in the Y-direction are formed. The memory trenches MT and the slits ST are alternately arranged along the X-direction. Each memory trench MT and each slit ST pierce the stacked body 12 to reach the silicon substrate 10. In the specification, the phrase "a constituent member extends in the Y-direction" means that the direction of the longest dimension of the constituent member is the Y-direction. The other directions are referred to in the same manner. The direction of the longest dimension of each memory trench MT and each slit ST is the Y-direction, and the direction of the second longest dimension is the Z-direction, and the direction of the shortest dimension is the X-direction.

In the stacked body 12, between the memory trench MT and the slit ST in the X-direction and also between the interlayer insulating films 14 in the Z-direction, one word line WL extending in the Y-direction, one tunneling insulating film 21 extending in the Y-direction, and a plurality of floating gate electrodes FG arranged along the Y-direction are provided. The word line WL, the tunneling insulating film 21, and the floating gate electrode FG are arranged in this order from the slit ST to the memory trench MT. The word line WL and the floating gate electrode FG are mutually separated by the tunneling insulating film 21. Each of the word line WL, the tunneling insulating film 21, and the floating gate electrode FG is in contact with the interlayer insulating films 14 on both sides in the Z-direction.

The word line WL is composed of a conductive material, and includes, for example, a main body portion (not shown) composed of tungsten (W) and a barrier metal layer (not shown) composed of titanium nitride (TiN). The barrier metal layer is disposed on an upper surface, on a lower surface, and on a side surface on a side of the tunneling insulating film 21 of the main body portion. The tunneling insulating film 21 is generally an insulating film, however, when a given voltage in a range of a driving voltage output from the control circuit CC is applied, it allows a tunneling current to flow therethrough. The tunneling insulating film 21 is formed of, for example, silicon oxide. The floating gate electrode FG is composed of a conductive material, and is formed of, for example, polysilicon containing impurities. On each side surface of each memory trench MT, the plurality of floating gate electrodes FG is arranged in a matrix along the X-direction and the Z-direction.

In each memory trench MT, a plurality of semiconductor members 20 is provided. The semiconductor members 20 are formed of, for example, silicon. The shape of each semiconductor member 20 is a substantially quadrangular columnar shape extending in the Z-direction, and a lower end thereof is connected to the silicon substrate 10. The plurality of semiconductor members 20 is mutually separately arranged in a line along the Y-direction. In the Y-direction, the semiconductor members 20 and the floating gate electrodes FG are disposed at the same position. Due to this, each semiconductor member 20 is disposed between the floating gate electrodes FG separated in the X-direction with the memory trench MT interposed therebetween. Further, the floating gate electrode FG is disposed between the semiconductor member 20 and the word line WL.

Between one semiconductor member 20 and the plurality of floating gate electrodes FG arranged in a line along the Z-direction, an inter-electrode insulating layer 22 is provided. Between the inter-electrode insulating layer 22 and the semiconductor member 20, a block insulating film 23 is provided. That is, the inter-electrode insulating layer 22 and the block insulating film 23 are arranged on both sides in the X-direction of each semiconductor member 20. The shape of each inter-electrode insulating layer 22 and each block insulating film 23 is a strip shape extending in the Z-direction. The thickness in the X-direction of the block insulating film 23 is thicker than the thickness in the X-direction of the tunneling insulating film 21.

The inter-electrode insulating layer 22 is formed of, for example, silicon oxide. In each block insulating film 23, from a side of the floating gate electrode FG to a side of the semiconductor member 20, a high dielectric constant layer 23a composed of a metal oxide such as hafnium oxide (HfO) or silicon nitride (SiN), a silicon oxide layer 23b composed of silicon oxide, and a high dielectric constant layer 23c composed of a metal oxide such as hafnium oxide or aluminum oxide (AlO) are stacked in this order. The average dielectric constant of the entire block insulating film 23 is higher than the average dielectric constant of the tunneling insulating film 21.

Structure bodies composed of the semiconductor member 20, the block insulating film 23, the inter-electrode insulating layer 22, and the floating gate electrode FG are mutually separately arranged in the Y-direction. Between the structure bodies, an insulating material may be buried, or an air gap may be formed. The structure bodies are configured to be substantially symmetric with respect to the semiconductor member 20 as a center on both sides in the X-direction. Due to this, from the semiconductor member 20, the block insulating film 23, the inter-electrode insulating layer 22, the floating gate electrode FG, the tunneling insulating film 21, and the word line WL are arranged in this order on both sides in the X-direction. Also in the slit ST, an insulating material may be buried, or an air gap may be formed.

As shown in FIG. 2, on the stacked body 12, a via 28 is provided, and on the via 28, a bit line BL extending in the X-direction is provided. The bit line BL is connected to an upper end of the semiconductor member 20 through the via 28.

Next, a method for driving the semiconductor memory device 1 according to the embodiment will be described.

Figure 4:
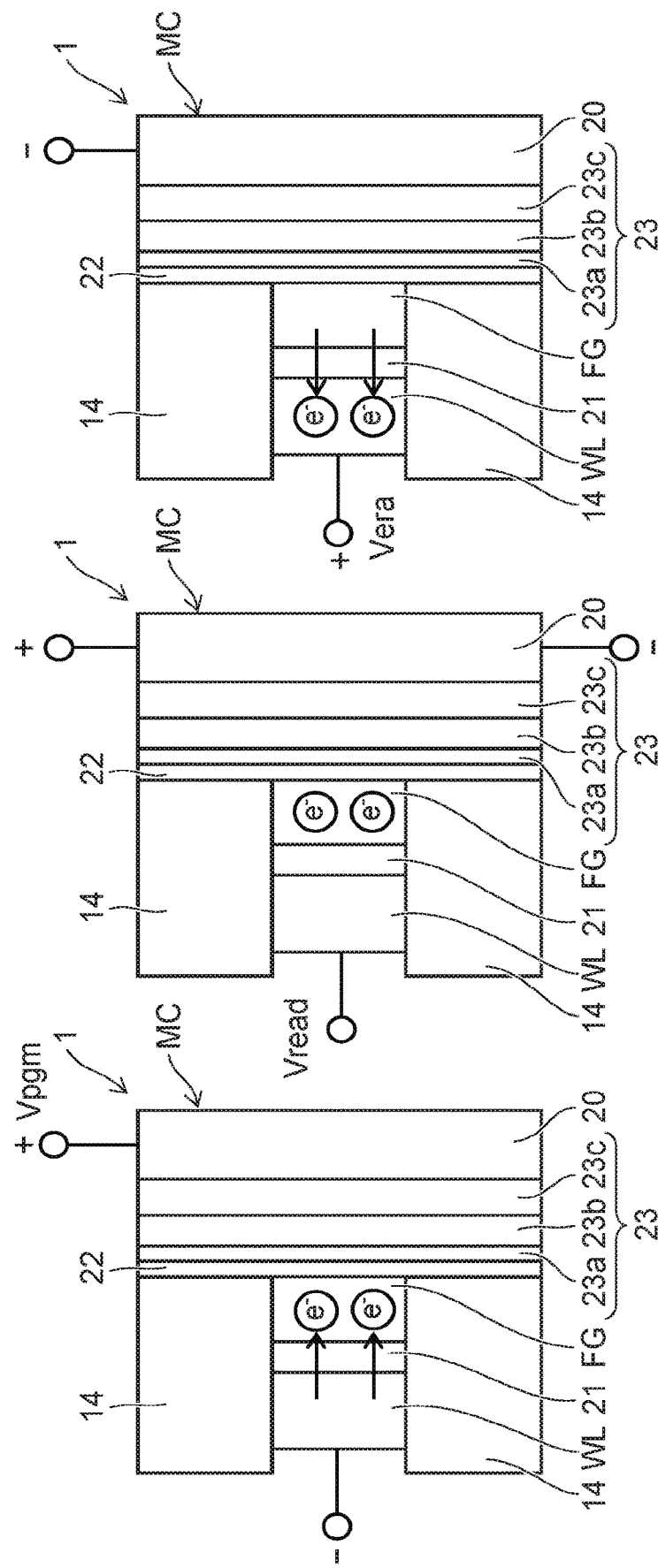
FIGS. 4A to 4C are views showing a method for driving the semiconductor memory device according to the first embodiment.

FIGS. 4A to 4C are views showing a method for driving the semiconductor memory device according to the embodiment, and FIG. 4A shows a program operation, FIG. 4B shows a read operation, and FIG. 4C shows an erase operation.

As shown in FIGS. 4A to 4C, in the semiconductor memory device 1 according to the embodiment, a memory cell MC including the floating gate electrode FG is formed at each crossing portion between the semiconductor member 20 and the word line WL. The memory cell MC is a field-effect transistor, and the semiconductor member 20 functions as a channel, the word line WL functions as a gate, the block insulating film 23 functions as a gate insulating film, and the floating gate electrode FG functions as a floating gate.

As shown in FIG. 4A, when data is programmed in a given memory cell MC (referred to as "selected cell"), the control circuit CC (see FIG. 1) applies a program voltage Vpgm between the word line WL and the semiconductor member 20 by using the word line WL as a negative electrode and using the semiconductor member 20 as a positive electrode. By doing this, an electron (e–) in the word line WL flows in the tunneling insulating film 21 as a tunneling current and is injected into the floating gate electrode FG. As a result, a threshold voltage of the memory cell MC is changed, and data is programmed.

As shown in FIG. 4B, when data programmed in the selected cell is read, the control circuit CC (see FIG. 1) applies a read voltage Vread between the semiconductor member 20 and the word line WL. The read voltage Vread is a voltage such that the degree of conduction of a selected cell changes depending on whether or not electrons are accumulated in the floating gate electrode FG of the selected cell. Further, the control circuit CC applies a voltage such that the memory cell MC becomes conductive regardless of whether electrons are accumulated in the floating gate electrode FG between the semiconductor member 20 and the other word lines WL. Then, the control circuit CC applies a voltage to the semiconductor member 20 and measures the amount of current flowing through the semiconductor member 20. By doing this, the control circuit CC evaluates the amount of electrons accumulated in the floating gate electrode FG of the selected cell and reads programmed data.

As shown in FIG. 4C, when data is erased from the memory cell MC, the control circuit CC (see FIG. 1) applies an erase voltage Vera between the word line WL and the semiconductor member 20 by using the word line WL as a positive electrode and using the semiconductor member 20 as a negative electrode. By doing this, an electron (e–) accumulated in the floating gate electrode FG flows in the tunneling insulating film 21 as a tunneling current and is discharged to the word line WL. As a result, data is erased from the memory cell MC.

Next, a method for manufacturing a semiconductor memory device according to the embodiment will be described.

FIGS. 5 to 14 are cross-sectional views showing a method for manufacturing a semiconductor memory device according to the embodiment.

Figure 10:
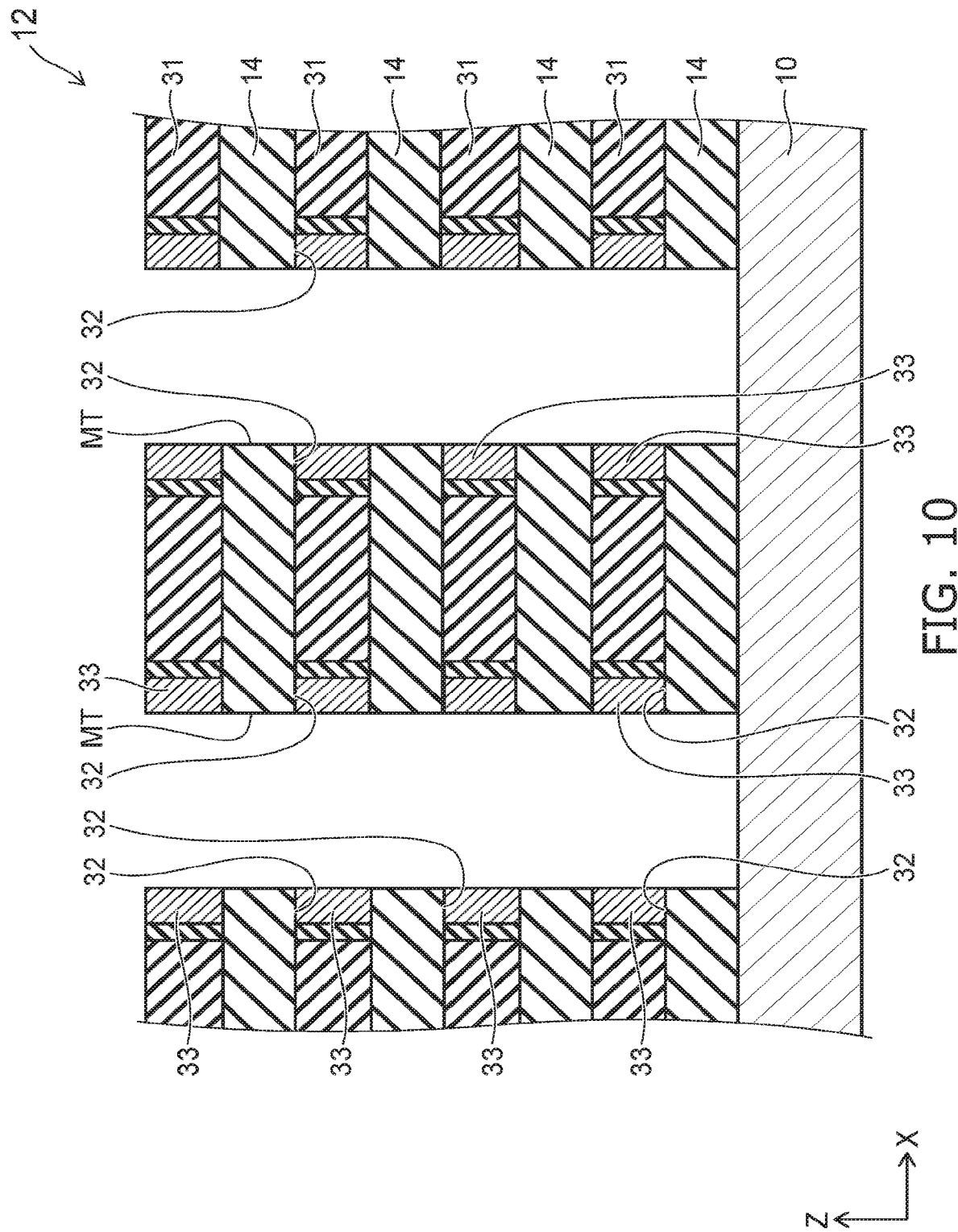
Figure 11:
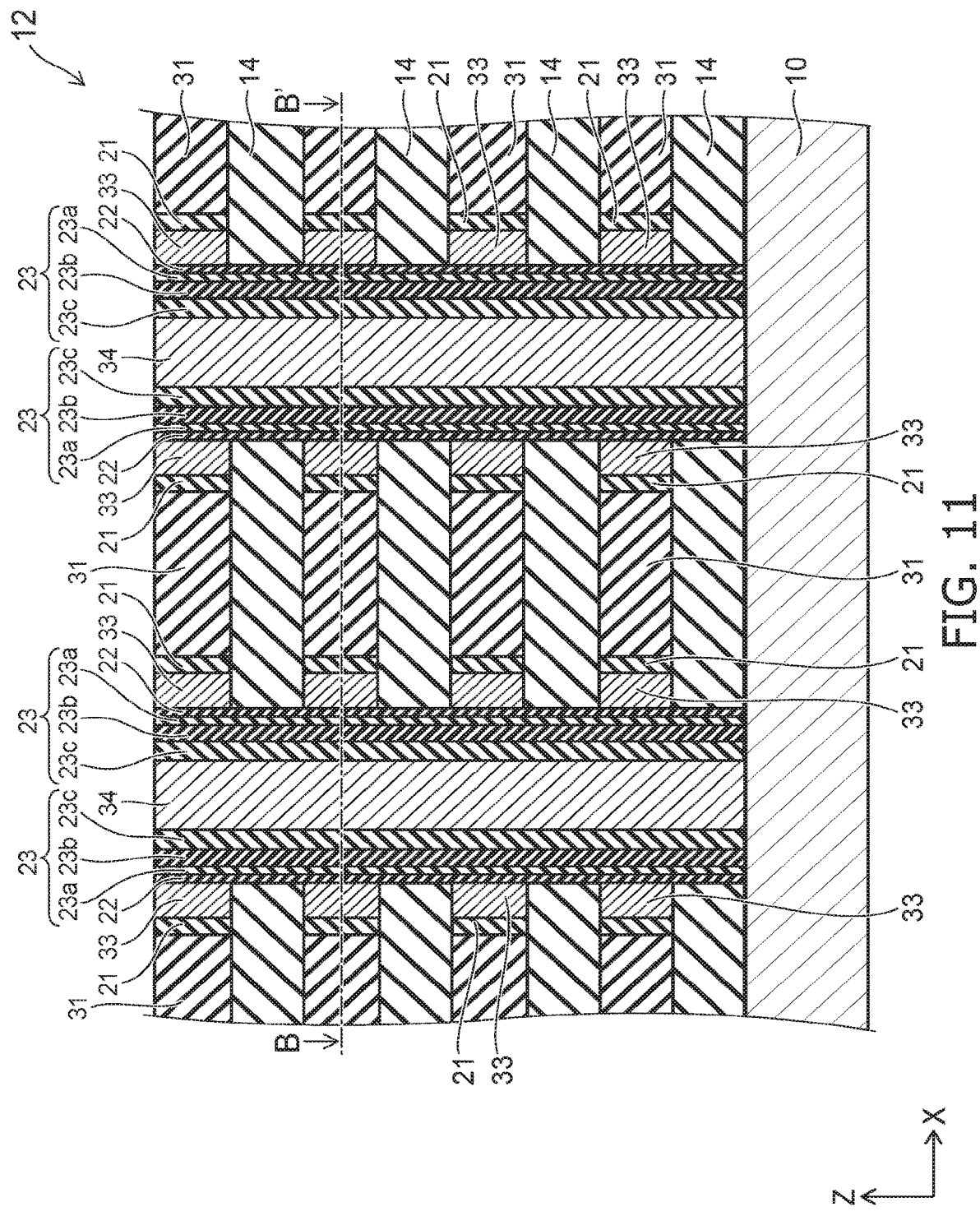
Figure 12:
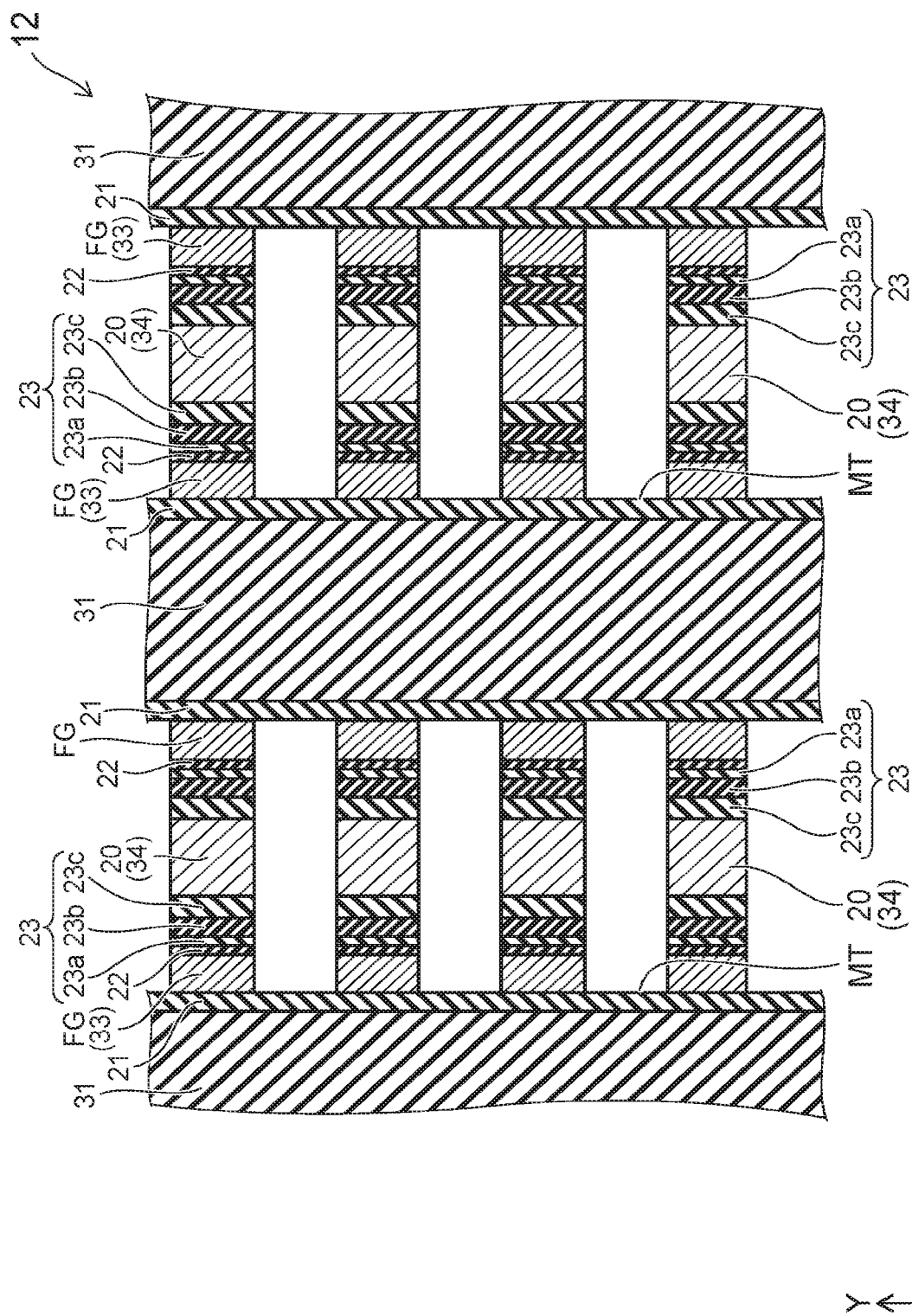

Among FIGS. 5 to 14, the drawings other than FIG. 12 show an XZ cross section. FIG. 12 is a cross-sectional view taken along the line B-B' shown in FIG. 11 and shows an XY cross section.

Figure 5:
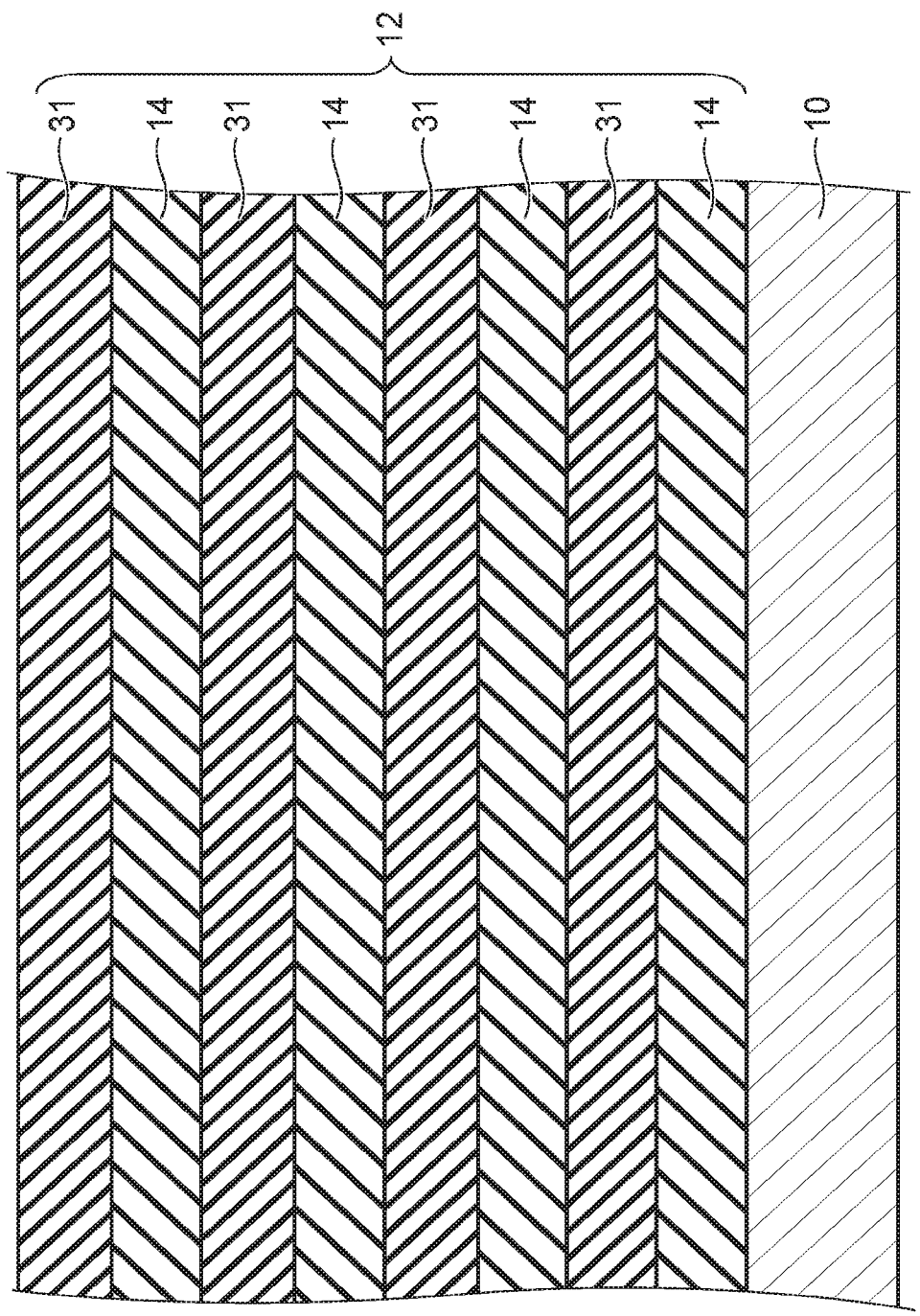
FIGS. 5 to 14 are cross-sectional views showing a method for manufacturing a semiconductor memory device according to the first embodiment.

First, as shown in FIG. 5, a silicon substrate 10 is prepared. Subsequently, on the silicon substrate 10, for example, by a CVD (Chemical Vapor Deposition) method, silicon oxide and silicon nitride are alternately deposited. By doing this, an interlayer insulating film 14 composed of silicon oxide and a silicon nitride film 31 are alternately stacked along the Z-direction, whereby a stacked body 12 is formed.

Figure 6:
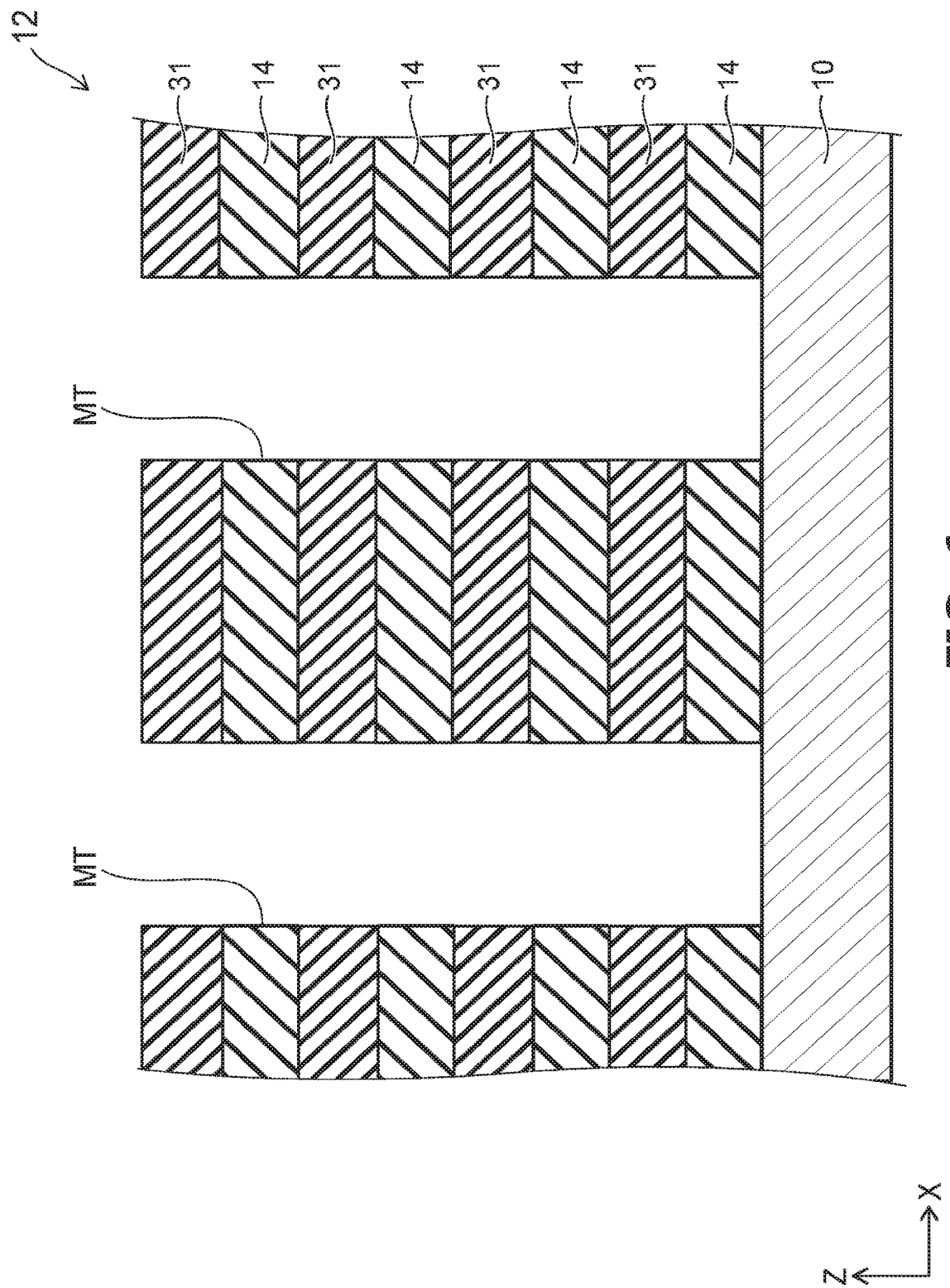

Subsequently, as shown in FIG. 6, for example, by a lithographic method and an RIE (Reactive Ion Etching) method, a plurality of memory trenches MT reaching the silicon substrate 10 and extending in the Y-direction is formed in the stacked body 12.

Figure 7:
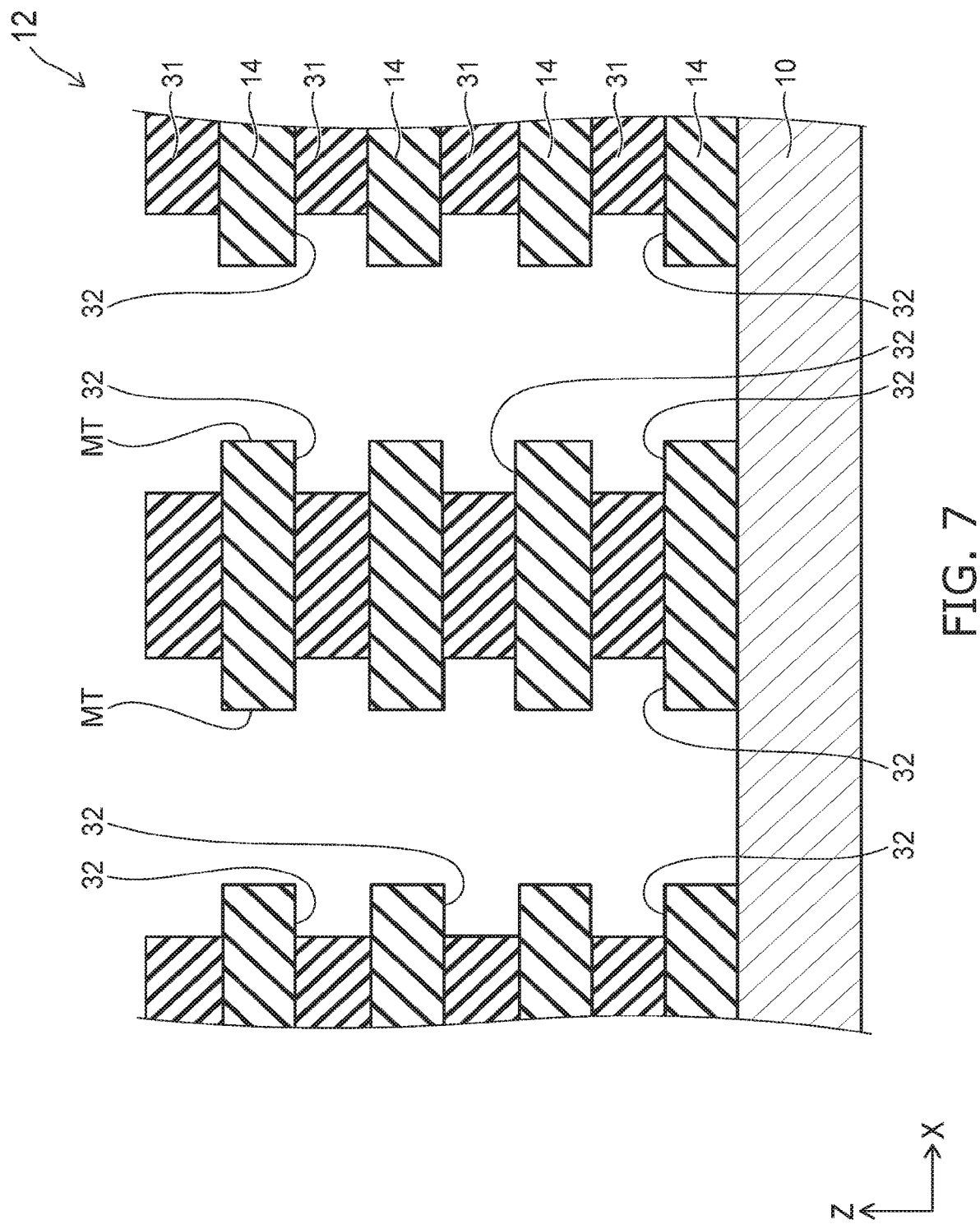

Subsequently, as shown in FIG. 7, through the memory trench MT, for example, wet etching using hot phosphoric acid is performed. By doing this, a portion exposed in the memory trench MT in the silicon nitride film 31 is removed, whereby a recessed portion 32 is formed on a side surface of the memory trench MT. The recessed portion 32 extends in the Y-direction along the memory trench MT.

Figure 8:
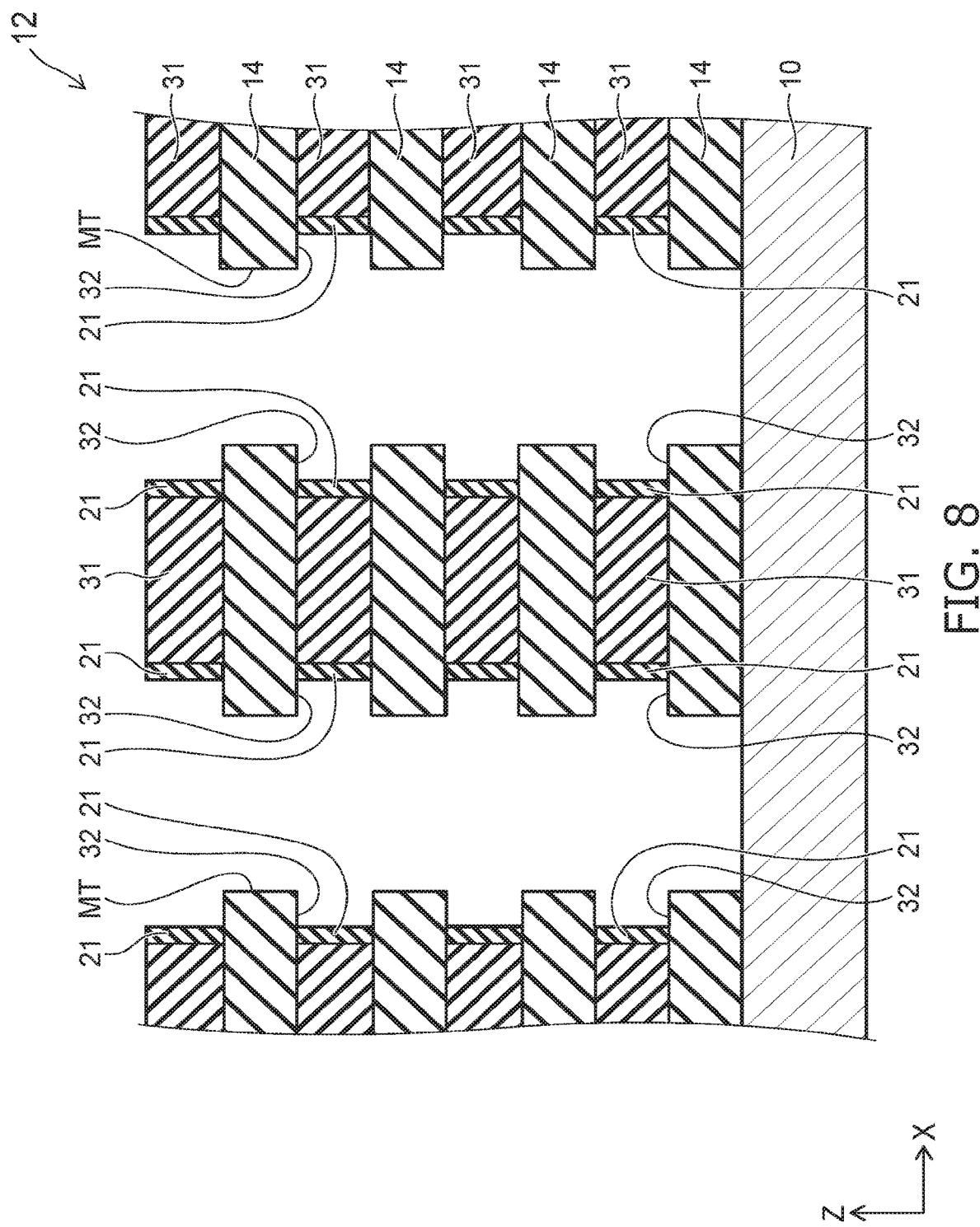

Subsequently, as shown in FIG. 8, an oxidation treatment is performed. By doing this, an exposed surface of the silicon nitride film 31 is oxidized, whereby a tunneling insulating film 21 composed of silicon oxide is formed on an innermost surface of the recessed portion 32.

Figure 9:
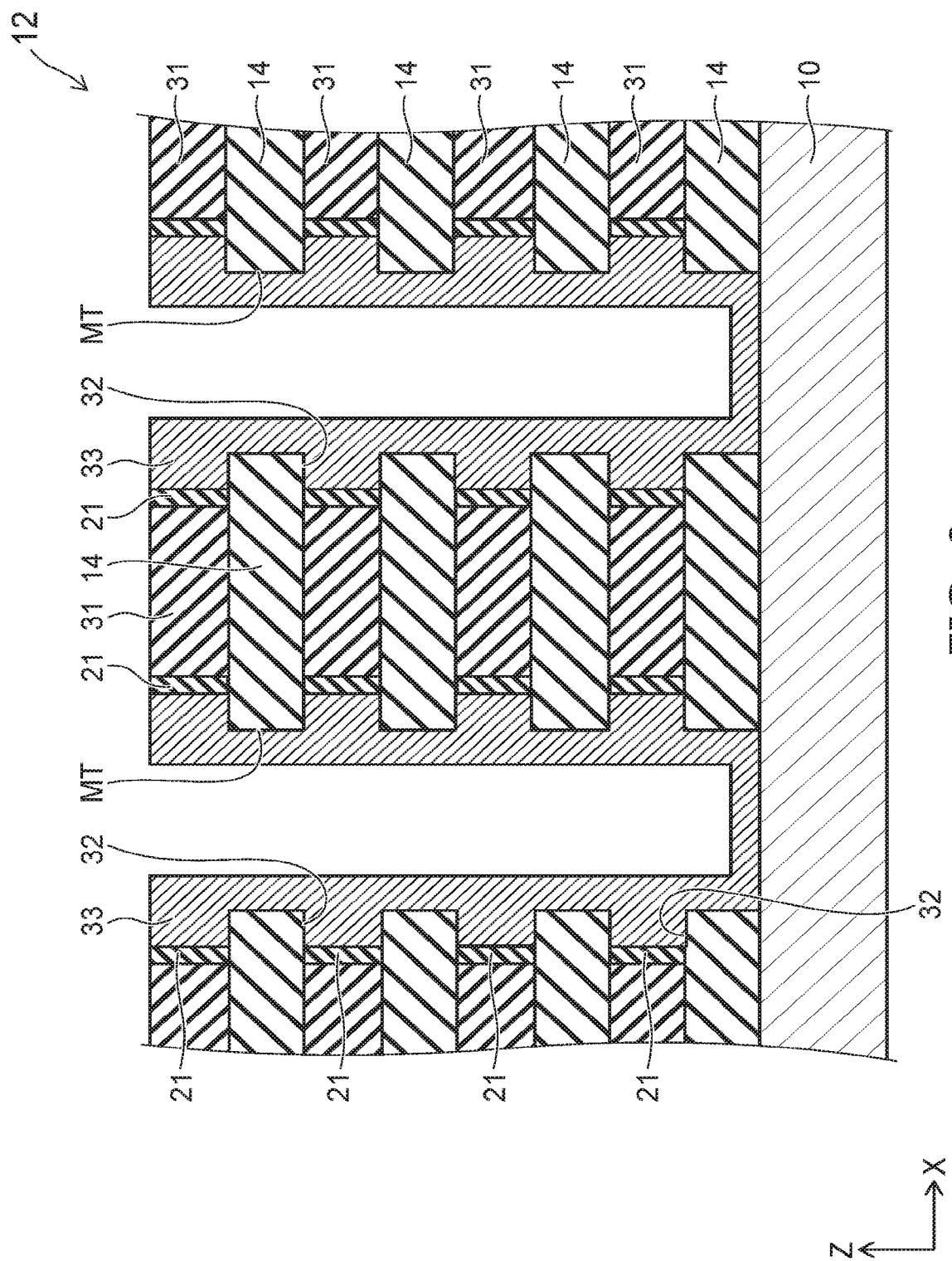

Subsequently, as shown in FIG. 9, by depositing silicon, a conductive silicon film 33 is formed on an inner surface of the memory trench MT. The deposition amount of the silicon film 33 is set such that silicon is buried in the recessed portion 32, but is not completely buried in the entire memory trench MT.

Subsequently, as shown in FIG. 10, for example, by performing anisotropic etching such as RIE, a portion deposited outside the recessed portion 32 in the silicon film 33 is removed. The silicon films 33 are left in the recessed portions 32 and mutually separated. At this stage, the silicon film 33 extends in the Y-direction along a side surface of the memory trench MT. On a side surface of the memory trench MT, the interlayer insulating film 14 and the silicon film 33 are exposed.

Subsequently, as shown in FIG. 11, on a side surface of the memory trench MT, silicon oxide is deposited, whereby an inter-electrode insulating layer 22 is formed. Subsequently, a high dielectric constant material, for example, a metal oxide such as hafnium oxide or silicon nitride is deposited, whereby a high dielectric constant layer 23a is formed. Subsequently, silicon oxide is deposited, whereby a silicon oxide layer 23b is formed. Subsequently, a metal oxide such as hafnium oxide or aluminum oxide is deposited, whereby a high dielectric constant layer 23c is formed. By the high dielectric constant layer 23a, the silicon oxide layer 23b, and the high dielectric constant layer 23c, a block insulating film 23 is formed. Incidentally, the "high dielectric constant material" refers to a material having a dielectric constant higher than the dielectric constant of silicon oxide. Subsequently, silicon is deposited, whereby a semiconductor member 34 is buried in the memory trench MT.

Subsequently, as shown in FIG. 12, the semiconductor member 34, the block insulating film 23, and the inter-electrode insulating layer 22 are selectively removed and divided in the Y-direction. As a result, the semiconductor member 34 is divided into a plurality of semiconductor members 20 in each memory trench MT. Subsequently, for example, wet etching using hot phosphoric acid is performed, whereby a portion exposed in the memory trench MT in the silicon film 33 is removed. By doing this, the silicon film 33 is divided along the Y-direction for each semiconductor member 20, whereby a floating gate electrode FG is formed. Incidentally, in a residual portion of the memory trench MT, silicon oxide (not shown) may be buried.

Figure 13:
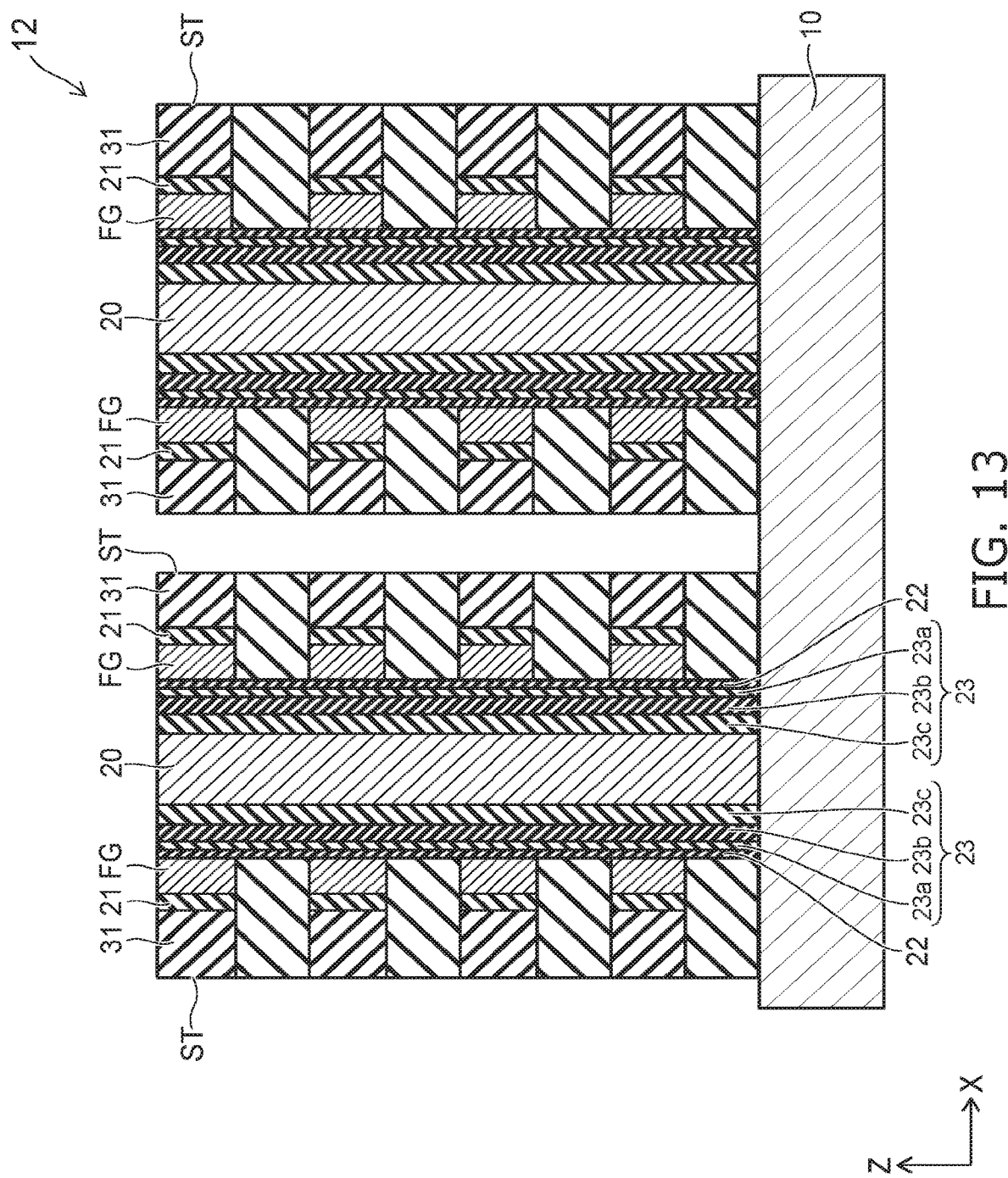

Subsequently, as shown in FIG. 13, in a portion between the memory trenches MT in the stacked body 12, a slit ST extending in the Y-direction is formed. The slit ST is allowed to reach the silicon substrate 10.

Figure 14:
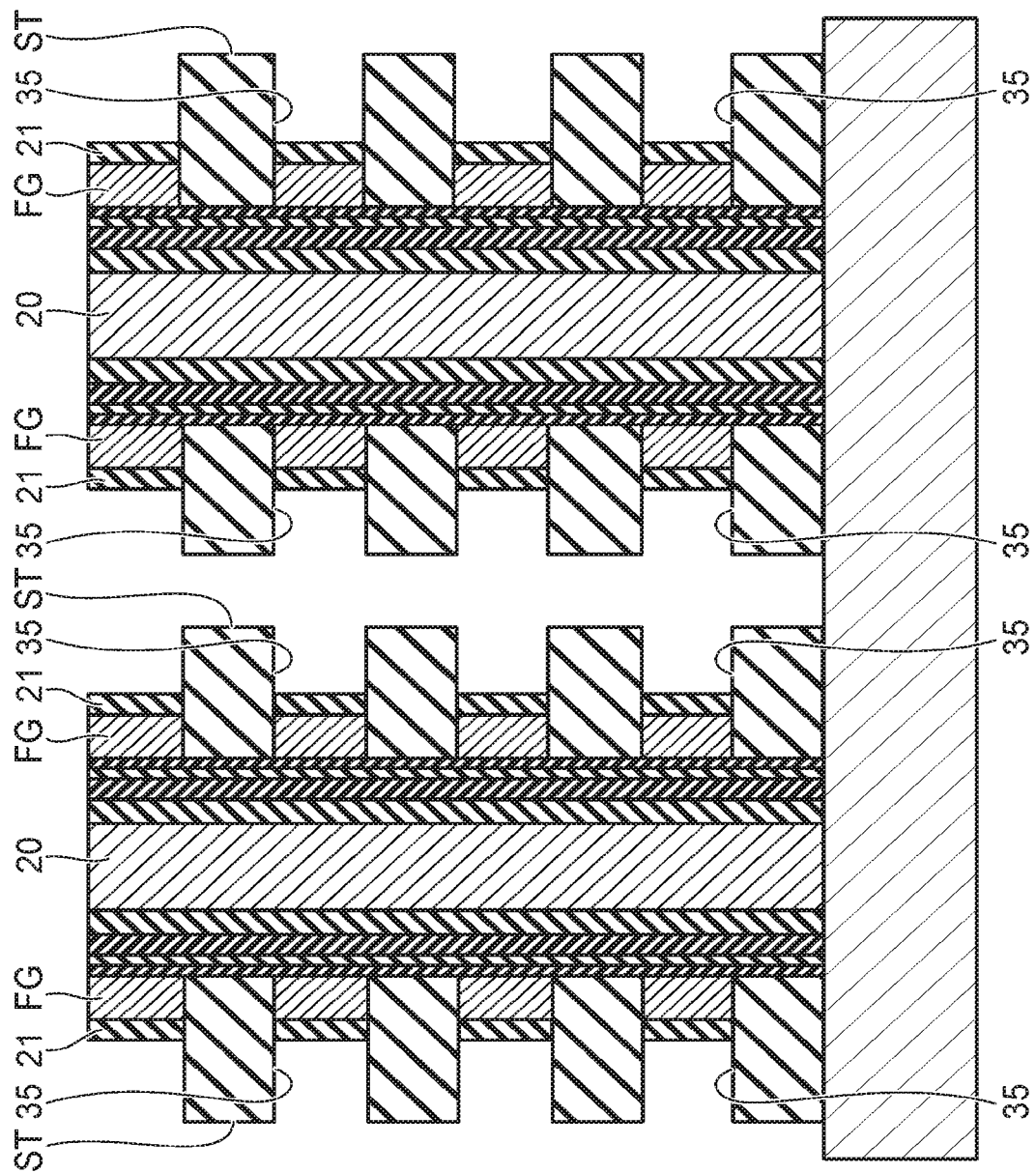

Subsequently, as shown in FIG. 14, etching is performed through the slit ST, whereby a residual portion of the silicon nitride film 31 is removed. For example, wet etching using hot phosphoric acid is performed. At this time, the tunneling insulating film 21 composed of silicon oxide functions as an etching stopper. By doing this, a recessed portion 35 extending in the Y-direction is formed on a side surface of the slit ST.

Subsequently, as shown in FIG. 2, for example, titanium nitride is deposited, whereby a barrier metal layer is formed on an inner surface of the slit ST, and then, tungsten is deposited. Subsequently, by performing anisotropic etching such as RIE, a portion deposited outside the recessed portion 35 in tungsten and the barrier metal layer is removed. By doing this, tungsten and the barrier metal layer are divided for each recessed portion 35, whereby a word line WL is buried in each recessed portion 35.

Subsequently, an insulating film (not shown) is formed on the semiconductor member 20, and a via 28 is formed in the insulating film and connected to an upper end of the semiconductor member 20. Subsequently, a bit line BL extending in the X-direction is formed on the insulating film and connected to the via 28. By doing this, the semiconductor memory device 1 according to the embodiment is manufactured.

Next, an effect of the embodiment will be described.

As shown in FIG. 3, in the semiconductor memory device 1 according to the embodiment, the floating gate electrode FG is provided throughout the entire length in the Z-direction of a space between the interlayer insulating films 14 adjacent to each other in the Z-direction. Due to this, the volume of the floating gate electrode FG is large, and the amount of electrons which can be accumulated therein is large. Therefore, the data holding characteristics of the memory cell MC are favorable. Further, since the amount of electrons which can be accumulated in the floating gate electrode FG is large, the threshold of the memory cell MC can be made to greatly change depending on whether or not electrons are accumulated in the floating gate electrode FG. As a result, the memory cell MC has a wide program/erase window and also has high operational reliability and stability.

Further, since the length in the Z-direction of the floating gate electrode FG is long, the gate length of the memory cell MC is long. Also this can increase the amount of change in the threshold of the memory cell MC and can expand the program/erase window of the memory cell MC.

Further, in the semiconductor memory device 1 according to the embodiment, the word line WL is provided throughout the entire length in the Z-direction of a space between the interlayer insulating films 14 adjacent to each other in the Z-direction. Due to this, the thickness in the Z-direction of the word line WL is thick, and therefore, the interconnect resistance is low. As a result, the operation speed of the semiconductor memory device 1 is high.

Still further, in the embodiment, the thickness of the block insulating film 23 in the X-direction is thicker than the thickness of the tunneling insulating film 21 in the X-direction. Due to this, a tunneling current is more difficult to flow through the block insulating film 23 than through the tunneling insulating film 21. As a result, a leakage current between the floating gate electrode FG and the semiconductor member 20 can be suppressed while transferring electrons between the word line WL and the floating gate electrode FG through the tunneling insulating film 21.

Further, since the dielectric constant of the entire block insulating film 23 is higher than the dielectric constant of the tunneling insulating film 21, when a voltage is applied between the word line WL and the semiconductor member 20, it is more difficult to apply an electric field to the block insulating film 23 than to the tunneling insulating film 21. Also this can suppress a leakage current through the block insulating film 23 while allowing a predetermined tunneling current to flow through the tunneling insulating film 21.

Further, in the semiconductor memory device 1, a surface facing the semiconductor member 20 in the word line WL does not have an annular shape surrounding the semiconductor member 20 but has a linear shape. Due to this, a strong electric field is never applied to the block insulating film 23 as compared with the tunneling insulating film 21. Also this can suppress a leakage current flowing through the block insulating film 23.

In the method for manufacturing the semiconductor memory device according to the embodiment, in the process shown in FIG. 8, by oxidizing the silicon nitride film 31, the tunneling insulating film 21 is formed. Therefore, the formation of the tunneling insulating film 21 is easy.

Further, in the process shown in FIG. 10, in order to remove a portion deposited inside the memory trench MT while leaving a portion deposited inside the recessed portion 32 in the silicon film 33, it is only necessary to perform etching under conditions that the silicon film 33 composed of silicon is selectively etched with respect to the interlayer insulating film 14 composed of silicon oxide, and therefore, etching is easy.

Further, in the process shown in FIG. 11, when the block insulating film 23 containing a high dielectric constant material is formed, it is not necessary to selectively remove the block insulating film 23 on a side surface of the memory trench MT, and therefore, it is easy to process the block insulating film 23. In this manner, it is easy to manufacture the semiconductor memory device according to the embodiment.

Comparative Example

Next, a comparative example will be described.

Figure 15:
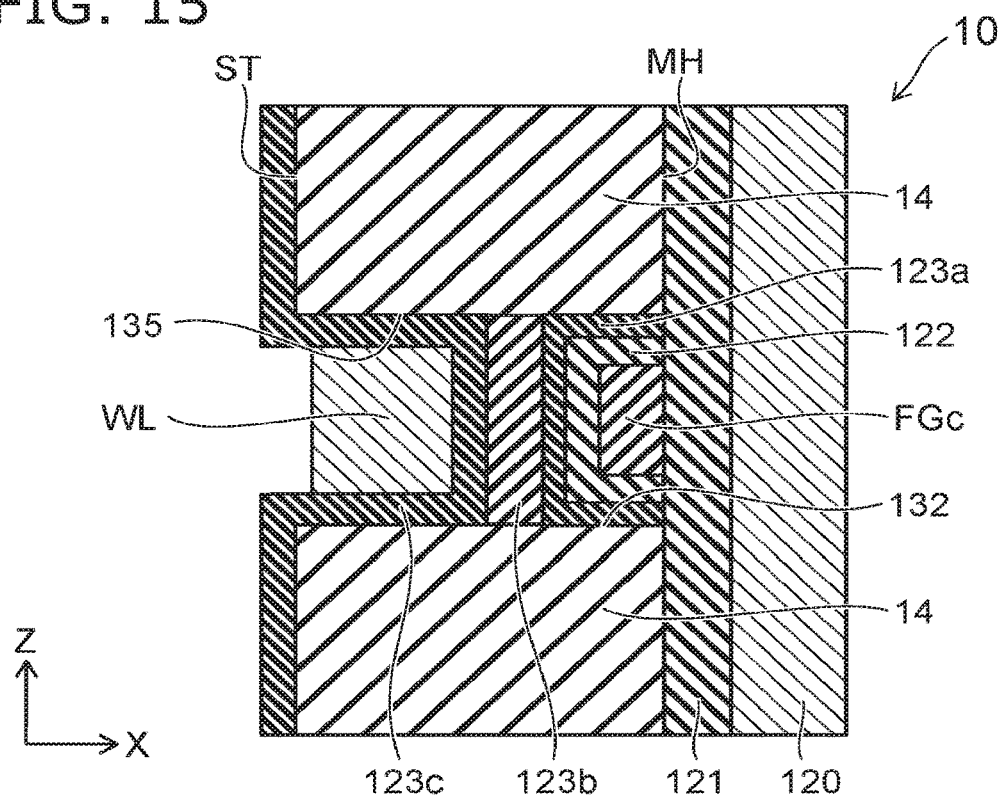
FIG. 15 is a cross-sectional view showing a semiconductor memory device according to a comparative example.

FIG. 15 is a cross-sectional view showing a semiconductor memory device according to the comparative example.

As shown in FIG. 15, in a semiconductor memory device 101 according to the comparative example, the shape of a semiconductor member 120 is a circular columnar shape extending in the Z-direction, and a word line WL surrounds the semiconductor member 120. From the semiconductor member 120 to the word line WL, a tunneling insulating film 121, a floating gate electrode FGc, an inter-electrode insulating layer 122, a high dielectric constant layer 123a, and a silicon oxide layer 123b are stacked in this order. The shape of the tunneling insulating film 121 is a circular cylindrical shape surrounding the semiconductor member 120. The shapes of the floating gate electrode FGc, the inter-electrode insulating layer 122, the high dielectric constant layer 123a, and the silicon oxide layer 123b are annular shapes surrounding the tunneling insulating film 121. A high dielectric constant layer 123c is formed on inner surfaces of a slit ST and a recessed portion 135. In the semiconductor memory device 101, a memory cell is driven by injecting and discharging electrons from the semiconductor member 120 to the floating gate electrode FGc through the tunneling insulating film 121.

The semiconductor memory device 101 according to the comparative example can be manufactured as follows. That is, as shown in FIG. 5, on a silicon substrate 10, an interlayer insulating film 14 and a silicon nitride film 31 are alternately deposited, whereby a stacked body is formed. Then, as shown in FIG. 15, a memory hole MH in a circular columnar shape is formed in the stacked body, and a silicon nitride film 31 (see FIG. 15) is recessed through the memory hole MH, whereby a recessed portion 132 in an annular shape is formed. Then, an exposed surface of the silicon nitride film 31 is oxidized, whereby a silicon oxide layer 123b is formed, and on inner surfaces of the memory hole and the recessed portion 132, a high dielectric constant layer 123a composed of, for example, hafnium oxide, an inter-electrode insulating layer 122 composed of silicon oxide, and a silicon film are formed. Then, the silicon film, the inter-electrode insulating layer 122, and the high dielectric constant layer 123a deposited outside the recessed portion 132 are removed, and also these members are left in the recessed portion 132 to bury the semiconductor member 120 in the memory hole MH, whereby a slit ST is formed in the stacked body. Then, through the slit ST, a residual portion of the silicon nitride film 31 is removed, whereby a recessed portion 135 is formed, and on inner surfaces of the slit ST and the recessed portion 135, a high dielectric constant layer 123c is formed, and a word line WL is formed in the recessed portion 135.

As shown in FIG. 15, in the semiconductor memory device 101 according to the comparative example, the high dielectric constant layer 123a, the inter-electrode insulating layer 122, and the floating gate electrode FGc are stacked in a space between the interlayer insulating films 14, and therefore, the length of the floating gate electrode FGc in the Z-direction is shorter than an interval between the interlayer insulating films 14. Due to this, the volume of the floating gate electrode FGc is small, and the amount of electrons which can accumulated therein is small. Further, since the length in the Z-direction of the floating gate electrode FGc is short, the gate length of the memory cell is short. Therefore, the memory cell has a narrow program/erase window and also has low operational reliability and stability.

Further, since the high dielectric constant layer 123c and the word line WL are stacked in the space between the interlayer insulating films 14, the thickness in the Z-direction of the word line WL is thin, and therefore, the interconnect resistance is high. As a result, the operation speed of the semiconductor memory device 101 is low.

Further, in the comparative example, it is difficult to perform a process of removing the silicon film, the inter-electrode insulating layer 122, and the high dielectric constant layer 123a deposited outside the recessed portion 132 through the memory hole.

Incidentally, also in the comparative example, in the same manner as the above-mentioned first embodiment, it is considered that electrons are injected and discharged from the word line WL to the floating gate electrode FGc, however, the semiconductor memory device 101 according to the comparative example has a small curvature on a side of the word line WL and a large curvature on a side of the semiconductor member 120, and therefore, an electric field is hardly applied between the word line WL and the floating gate electrode FGc, and an electric field is easily applied between the semiconductor member 120 and the floating gate electrode FGc. Due to this, coupling between the word line WL and the floating gate electrode FGc is weak, and a program/erase window is narrow. As a result, it is difficult to transfer electrons between the word line WL and the floating gate electrode FGc while suppressing a leakage current between the semiconductor member 120 and the floating gate electrode FGc.

Second Embodiment

Next, a second embodiment will be described.

Figure 16:
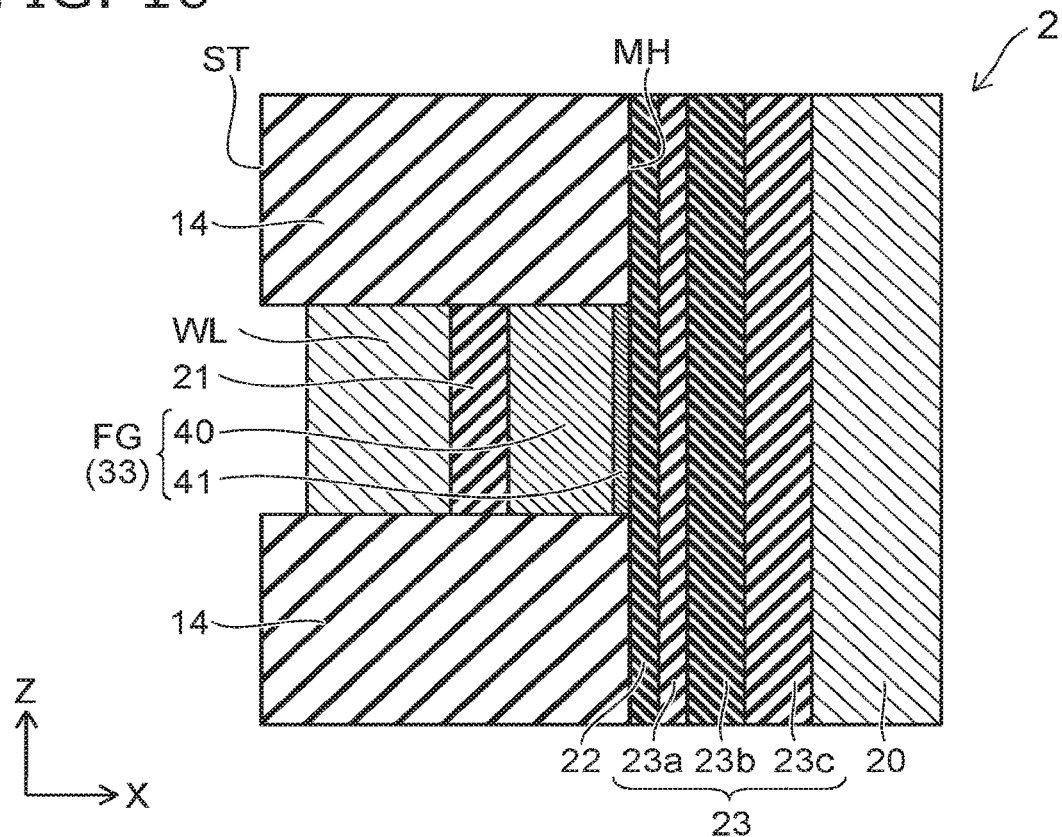
FIG. 16 is a cross-sectional view showing a semiconductor memory device according to a second embodiment.

FIG. 16 is a cross-sectional view showing a semiconductor memory device according to the embodiment.

As shown in FIG. 16, a semiconductor memory device 2 according to the embodiment is different from the semiconductor memory device 1 (see FIG. 3) according to the above-mentioned first embodiment in that a silicide layer 41 composed of a metal silicide is formed in a portion on a side of an inter-electrode insulating layer 22 in a floating gate electrode FG. That is, in a floating gate electrode FG, a main body portion 40 composed of silicon and a silicide layer 41 disposed between the main body portion 40 and a block insulating film 23 are provided.

Next, a method for manufacturing the semiconductor memory device 2 according to the embodiment will be described.

First, the processes shown in FIGS. 5 to 10 are performed.

Subsequently, on an inner surface of a memory trench MT, for example, a metal such as titanium (Ti) or cobalt (Co) is deposited. Subsequently, a heat treatment such as RTA (Rapid Thermal Anneal) is performed, whereby the deposited metal is reacted with silicon contained in a silicon film 33. The silicon film 33 is a film which will become a floating gate electrode FG in the subsequent process. By doing this, on a surface exposed on the memory trench MT in the silicon film 33, a silicide layer 41 is formed. Subsequently, a wet treatment using sulfuric acid/hydrogen peroxide is performed, whereby the unreacted metal is removed. The subsequent processes are the same as those in the above-mentioned first embodiment.

According to the embodiment, by providing the silicide layer 41 on a surface on a far side from the word line WL in the floating gate electrode FG, an electron capture ability of the floating gate electrode FG can be improved. The other configuration, manufacturing method, and effect of the embodiment are the same as those of the above-mentioned first embodiment.

Third Embodiment

Next, a third embodiment will be described.

The configuration of a semiconductor memory device according to the embodiment is the same as that of the above-mentioned second embodiment.

Next, a method for manufacturing the semiconductor memory device according to the embodiment will be described.

Figure 17:
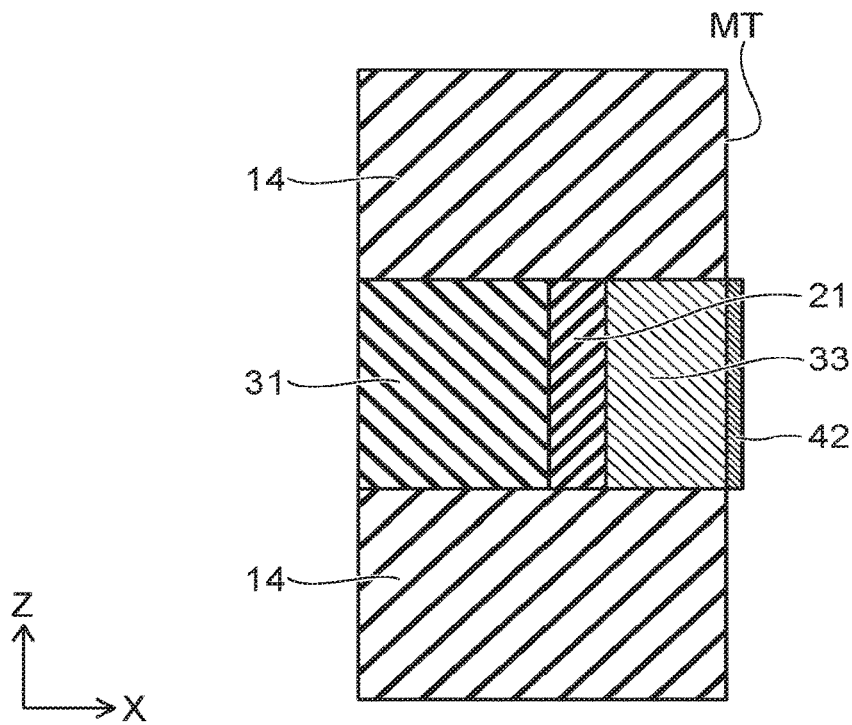
FIG. 17 is a cross-sectional view showing a method for manufacturing a semiconductor memory device according to a third embodiment.

FIG. 17 is a cross-sectional view showing the method for manufacturing the semiconductor memory device according to the embodiment.

First, the processes shown in FIGS. 5 to 10 are performed.

Subsequently, as shown in FIG. 17, for example, by an ALD (Atomic Layer Deposition) method or a CVD method using a metal source, a metal such as titanium or cobalt is selectively deposited on a region where a silicon film 33 is exposed in an inner surface of a memory trench MT. This can be realized by, for example, stopping the deposition before starting the growth of the metal on silicon oxide after starting the growth of the metal on silicon utilizing a difference in an incubation time in the deposition of the metal. By doing this, a metal layer 42 is formed on a surface exposed in the memory trench MT in the silicon film 33.

Subsequently, a nitriding treatment is performed, whereby a surface of the metal layer 42 is nitrided. Subsequently, a heat treatment such as RTA is performed, whereby the entire metal layer 42 is reacted with silicon contained in the silicon film 33. By doing this, on a surface exposed on the memory trench MT in the silicon film 33, a silicide layer 41 is formed. At this time, the metal layer 42 disappears. The subsequent processes are the same as those in the above-mentioned first embodiment.

According to the embodiment, as compared with the above-mentioned second embodiment, the process of removing the unreacted metal by the sulfuric acid/hydrogen peroxide treatment can be omitted. In addition, by nitriding the surface of the metal layer 42, diffusion of the metal contained in the metal layer 42 in the silicon film 33 can be suppressed. The other configuration, manufacturing method, and effect of the embodiment are the same as those of the above-mentioned second embodiment.

Fourth Embodiment

Next, a fourth embodiment will be described.

Figure 18:
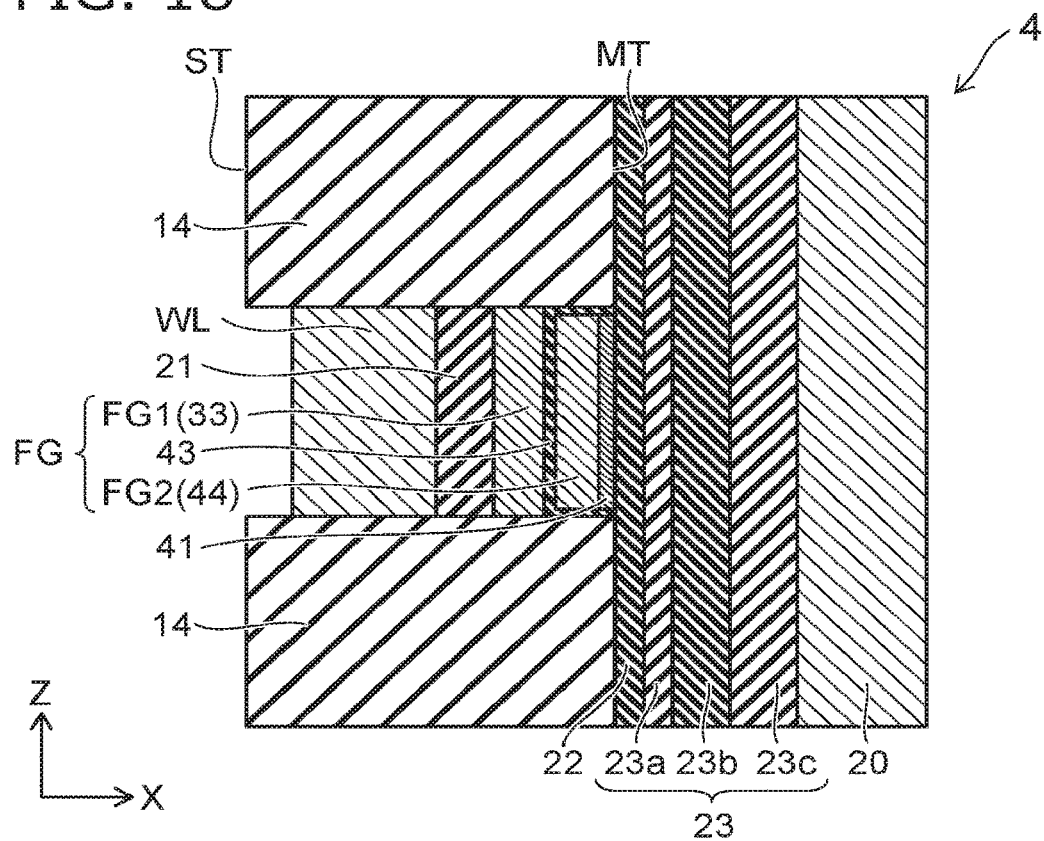
FIG. 18 is a cross-sectional view showing a semiconductor memory device according to a fourth embodiment.

FIG. 18 is a cross-sectional view showing a semiconductor memory device according to the embodiment.

As shown in FIG. 18, a semiconductor memory device 4 according to the embodiment is different from the semiconductor memory device 2 (see FIG. 16) according to the above-mentioned second embodiment in that a conductive portion FG1, an inter-electrode insulating layer 43, and a conductive portion FG2 are provided in a floating gate electrode FG. The conductive portions FG1 and FG2 are formed of silicon. The inter-electrode insulating layer 43 is formed of, for example, an insulating material such as silicon nitride. The conductive portion FG1 is disposed on a side of a word line WL, and the conductive portion FG2 is disposed on a side of a semiconductor portion 20. A portion of the inter-electrode insulating layer 43 is disposed between the conductive portion FG1 and the conductive portion FG2, and a residual portion is disposed on an upper surface and on a lower surface of the conductive portion FG2. The conductive portion FG2 is insulated from the conductive portion FG1 by the inter-electrode insulating layer 43.

Next, a method for manufacturing the semiconductor memory device according to the embodiment will be described.

First, the processes shown in FIGS. 5 to 10 are performed. At this time, on a side surface of a memory trench MT, an exposed surface of a silicon film 33 is recessed from an exposed surface of an interlayer insulating film 14.

Subsequently, as shown in FIG. 18, a nitriding treatment is performed, whereby the silicon film 33 is nitrided. By doing this, on the exposed surface of the silicon film 33, an inter-electrode insulating layer 43 composed of silicon nitride is formed. Subsequently, silicon is deposited again, whereby a silicon film 44 is formed on an inner surface of the memory trench MT. Subsequently, the silicon film 44 is etched, whereby a portion deposited outside a recessed portion 32 is removed. Subsequently, in the same manner as in the above-mentioned third embodiment, a metal is selectively deposited and nitrided, and then, a heat treatment such as RTA is performed. By doing this, a silicide layer 41 is formed. The subsequent processes are the same as those in the above-mentioned first embodiment. In the process shown in FIG. 12, the silicon film 33 is divided to form a conductive portion FG1, and the silicon film 44 is divided to form a conductive portion FG2.

According to the embodiment, by providing the inter-electrode insulating layer 43 in the floating gate electrode FG, an electron capture ability of the floating gate electrode FG can be further improved. The other configuration, manufacturing method, and effect of the embodiment are the same as those of the above-mentioned third embodiment.

Fifth Embodiment

Next, a fifth embodiment will be described.

Figure 19:
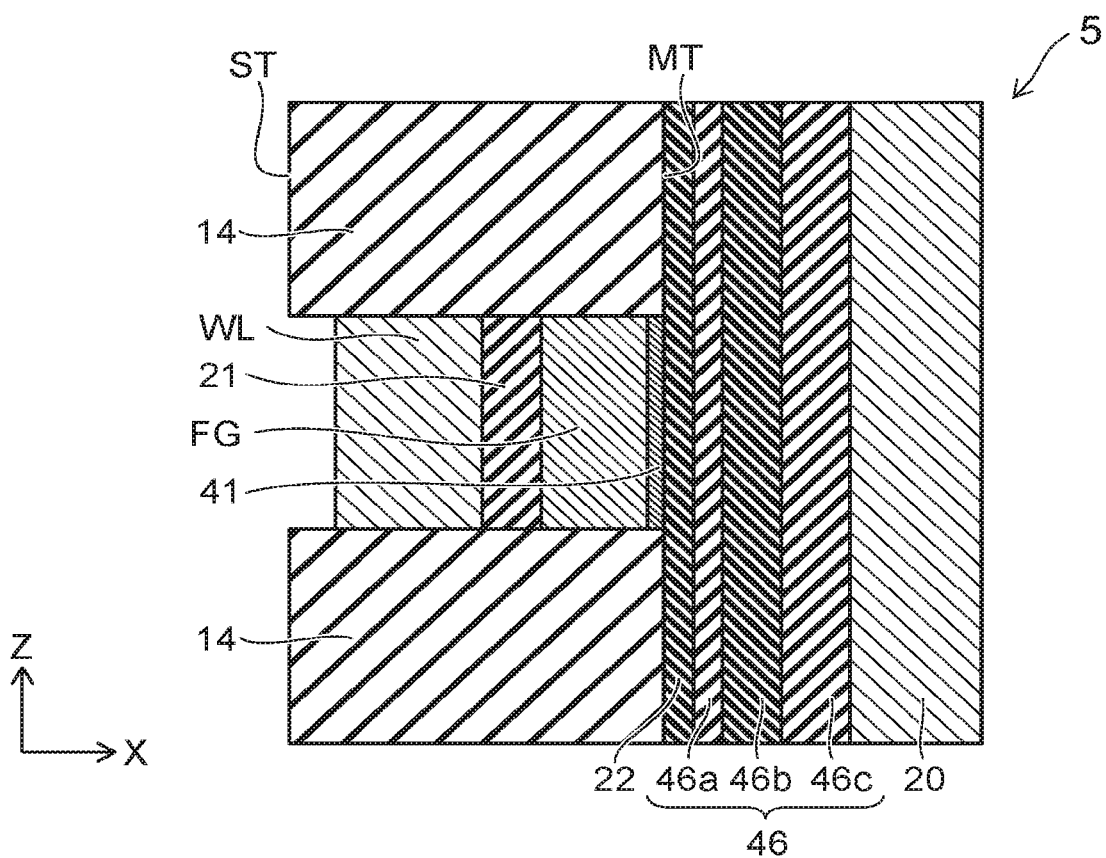
FIG. 19 is a cross-sectional view showing a semiconductor memory device according to a fifth embodiment.

FIG. 19 is a cross-sectional view showing a semiconductor memory device according to the embodiment.

As shown in FIG. 19, a semiconductor memory device 5 according to the embodiment is different from the semiconductor memory device 2 (see FIG. 16) according to the above-mentioned second embodiment in that a block insulating film 46 is provided in place of the block insulating film 32. In the block insulating film 46, from a side of a floating gate electrode FG to a side of a semiconductor member 20, a silicon oxide layer 46a, a silicon nitride layer 46b, and a silicon oxide layer 46c are stacked in this order. In the X-direction, the block insulating film 46 is thicker than a tunneling insulating film 21, and an average dielectric constant of the entire block insulating film 46 is higher than the dielectric constant of the tunneling insulating film 21 composed of silicon oxide.

In the embodiment, the block insulating film 46 is formed as an ONO film, and a metal oxide is not used as a material of the block insulating film 46. According to this, the reliability of the block insulating film 46 can be increased. The other configuration, manufacturing method, and effect of the embodiment are the same as those of the above-mentioned third embodiment.

Sixth Embodiment

Next, a sixth embodiment will be described.

Figure 20:
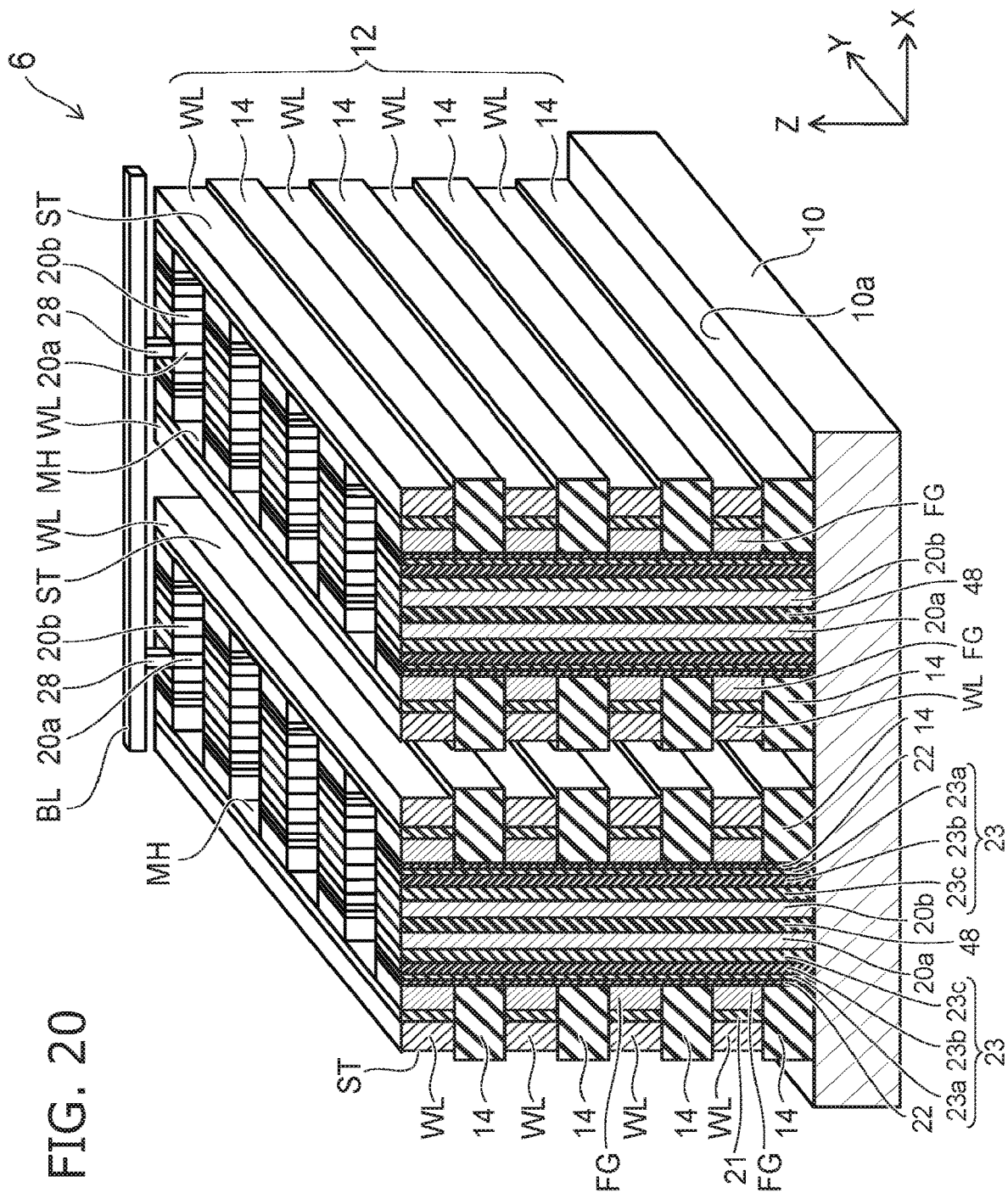
FIG. 20 is a perspective view showing a semiconductor memory device according to a sixth embodiment.

FIG. 20 is a perspective view showing a semiconductor memory device according to the embodiment.

As shown in FIG. 20, a semiconductor memory device 6 according to the embodiment is different from the semiconductor memory device 1 (see FIG. 2) according to the above-mentioned first embodiment in that semiconductor members 20a and 20b are provided in place of the semiconductor member 20. In each memory trench MT, the semiconductor members 20a and 20b are arranged in the X-direction and mutually separated. That is, in the semiconductor memory device 6, in each memory trench MT, the semiconductor members 20a and 20b are arranged in two lines along the Y-direction. Between the semiconductor member 20a and the semiconductor member 20b, an insulating member 48 composed of, for example, silicon oxide is provided.

According to the embodiment, in the memory cells MC adjacent to each other in the X-direction, the semiconductor members 20a and 20b which are different from each other are provided, and therefore, an interaction between the memory cells MC can be suppressed. The other configuration and effect of the embodiment are the same as those of the above-mentioned first embodiment.

The embodiments described above can realize a semiconductor memory device having high operational reliability and stability, and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device, comprising:
a substrate, wherein a first direction is perpendicular to a surface of the substrate, a second direction is parallel to the surface of the substrate, a third direction is crossing the first direction and the second direction, and the third direction is parallel to the surface of the substrate;

a plurality of first insulating films provided above the substrate, the plurality of first insulating films being mutually separately arranged along the first direction and the second direction, and extending in the third direction, the direction of the longest dimension of each of the plurality of first insulating films being the third direction;

an interconnect disposed between the first insulating films in the first direction and extending in the third direction, the direction of the longest dimension of the interconnect being the third direction;

a plurality of electrodes disposed between the first insulating films in the first direction, and mutually separately arranged along the third direction, the electrodes being in direct contact with one of the first insulating films;

a second insulating film disposed between the interconnect and the plurality of electrodes;

a plurality of semiconductor members mutually separately arranged along the third direction between the first insulating films in the second direction and extending in the first direction, the direction of the longest dimension of each of the plurality of semiconductor members being the first direction, the electrode being disposed between the interconnect and one of the plurality of semiconductor members; and a third insulating film disposed between the plurality of electrodes and each of the semiconductor members and being thicker than the second insulating film.

2. The device according to claim 1, wherein the average dielectric constant of the third insulating film is higher than the average dielectric constant of the second insulating film.

3. The device according to claim 1, wherein the interconnect is in direct contact with the first insulating film.

4. The device according to claim 1, wherein
the electrodes include
a main body portion composed of silicon, and
a silicide layer disposed between the main body portion and the third insulating film and composed of a metal silicide.

5. The device according to claim 1, wherein the plurality of semiconductor members is arranged in a line along the second direction between the first insulating films adjacent to each other in the second direction.

6. The device according to claim 1, wherein the plurality of semiconductor members is arranged in two lines along the second direction between the first insulating films adjacent to each other in the second direction.

7. The device according to claim 1, wherein
the electrodes include
a conductive first portion,
a conductive second portion disposed between the first portion and the third insulating film, and
an insulating third portion disposed between the first portion and the second portion.

8. The device according to claim 1, further comprising a control circuit which injects electrons into the electrodes from the interconnect through the second insulating film by applying a first voltage between the interconnect and the semiconductor member using the interconnect as a negative electrode and using the semiconductor member as a positive electrode, and discharges electrons from the electrodes to the interconnect through the second insulating film by applying a second voltage between the interconnect and the semiconductor member using the interconnect as a positive electrode and using the semiconductor member as a negative electrode.

9. The device according to claim 8, wherein the control circuit evaluates an amount of electrons accumulated in the electrodes by measuring an amount of current flowing through the semiconductor member while applying a third voltage between the interconnect and the semiconductor member.

10. The device according to claim 1, wherein the semiconductor members are disposed in every other spaces along the second direction, each of the spaces is located between the first insulating films adjacent to each other in the second direction.

11. The device according to claim 1, wherein the second insulating film contains silicon and oxygen.

12. The device according to claim 1, wherein the third insulating film contains silicon, metal and oxygen.

13. The device according to claim 12, wherein the metal is hafnium or aluminum.

14. The device according to claim 1, wherein
the third insulating film includes
a first layer disposed on the electrodes side, and contains silicon nitride and metal oxide,
a second layer disposed on the semiconductor member side, and contains metal oxide, and
a third layer disposed between the first layer and the second layer, and contains silicon oxide.

15. The device according to claim 1, wherein the third insulating film, the electrode, the second insulating film, and the interconnect are arranged in this order from the semiconductor member on both sides in the second direction.

16. The device according to claim 1, wherein the second insulating film extends in the third direction.

* * * * *